United States Patent

Brouillette et al.

[11] Patent Number: 5,913,125
[45] Date of Patent: Jun. 15, 1999

[54] METHOD OF CONTROLLING STRESS IN A FILM

[75] Inventors: Donald Walter Brouillette, St. Albans; Timothy Charles Krywanczyk; Jerome Brett Lasky, both of Essex Junction; Rick Lawrence Mohler, Williston, all of Vt.; Wolfgang Otto Rauscher, Schwaikheim, Germany

[73] Assignee: International Business Machines Corporation, Armonk, N.Y.

[21] Appl. No.: 08/607,621

[22] Filed: Feb. 27, 1996

Related U.S. Application Data

[63] Continuation of application No. 08/300,114, Sep. 2, 1994, abandoned, which is a continuation of application No. 07/905,576, Jun. 26, 1992, abandoned.

[51] Int. Cl.$^6$ .................................................. H01L 21/20
[52] U.S. Cl. ........................... 438/386; 438/239; 438/243; 438/245; 438/388
[58] Field of Search ................................ 437/47, 60, 162; 438/238, 239, 243, 244, 386, 388, 245

[56] References Cited

U.S. PATENT DOCUMENTS

| | | | |
|---|---|---|---|
| 4,645,564 | 2/1987 | Morie et al. | 437/233 |
| 4,666,556 | 5/1987 | Fultom et al. | 437/162 |
| 4,688,063 | 8/1987 | Lu et al. | 357/23.6 |
| 4,748,133 | 5/1988 | Griswold | 437/43 |
| 4,801,988 | 1/1989 | Kenney | 357/23.6 |
| 4,803,535 | 2/1989 | Taguchi | 357/23.6 |
| 4,873,205 | 10/1989 | Critchlow et al. | 437/200 |
| 4,931,897 | 6/1990 | Tsukamoto et al. | 361/313 |
| 4,977,104 | 12/1990 | Sawada et al. | 437/162 |
| 5,141,892 | 8/1992 | Beinglass | 437/162 |

FOREIGN PATENT DOCUMENTS

| | | | |
|---|---|---|---|
| 0281233 | 1/1987 | European Pat. Off. | H01L 21/31 |
| 3504184 | 8/1985 | Germany . | |
| 0124736 | 6/1987 | Japan . | |
| 1-304723 | 12/1989 | Japan | H01L 21/205 |
| 0072658 | 3/1990 | Japan | 437/919 |

OTHER PUBLICATIONS

English translation of JP–0227658 (Watanabe).

"Polycrystalline Silicon Micromechanical Beams," Howe et al., The Electrochemical Society, Inc., May 1982, pp. 184–185.

"Low–Stress Tungsten Films," Ahn et al., IBM TDB, Jan. 1987, vol. 29, No. 8, pp. 3645–3646.

Murarka et al. "Effect of Phosphorus Doping on Stress in Silicon and Polycrystalline Silicon" J. App. Phys. Apr. 1983 2069–2072.

Miura "Crystallization–induced Stress in Silicon Thin Films" Appl. Phys. Lett Jun. 1 1992.

Adamczewska "Stress in Chemically Vapour–Deposited Silicon Films" Thin Solid Films 113 (1984) 271–285.

Silicon Processing For The VLSI ERA vol.1: Process Technology, Stanley Wolf Ph.D., Richard N. Tauber Ph.D, Lattic Press Sunset Beach, California, Copyright © 1986.

*Primary Examiner*—Trung Dang
*Attorney, Agent, or Firm*—Eugene I. Shkurko

[57] ABSTRACT

A method of providing a predetermined level and state of stress in a film deposited on a surface of a substrate. In one embodiment, a layer of crystalline material is deposited on a surface of a substrate and then a layer of amorphous material is deposited on the layer of crystalline material. Then, the layers are heated, causing the amorphous material to crystallize. Such crystallization reduces, or even changes the state of, stress in the amorphous layer, which in turn alters the forces applied by the layer to adjacent regions of the substrate. The method may be used for filling a deep-trench capacitor of the type used in trench-storage DRAMs.

2 Claims, 3 Drawing Sheets

METHOD OF CONTROLLING STRESS IN A FILM

This is a application continuation of application Ser. No. 08/300,114 field on Sep. 2, 1994 now abandoned which is a continuation of application Ser. No. 07/905,576 field on Jun. 26, 1992 now abandoned.

FIELD OF THE INVENTION

The present invention relates to methods of controlling the stress in thin films of the type used in semiconductor fabrication, and, more particularly, to a method of controlling the state and amount of stress in material used to fill high aspect ratio trenches in silicon substrates.

BACKGROUND OF THE INVENTION

In trench storage dynamic random access memory (DRAM) devices, the capacitive elements of the devices are typically formed in deep trenches provided in the silicon substrate. As used herein, "deep" or "high aspect ratio" trenches are trenches having a depth that is typically 10 or more times the diameter of the trench. Although these DRAM devices function highly satisfactorily, as a result of the continuing effort to increase DRAM density and performance, a need exists to increase the period of time such devices retain a charge.

Retention time is adversely affected by charge leakage occurring via interstitial dislocations in portions of the silicon substrate adjacent the trench in which the capacitor is formed. Such dislocations are apparently caused, in part, by inherent compressive stresses in the trench fill material used in the fabrication of the capacitive device. The compressive stress in the fill causes the walls of the trench to bow outwardly, which deflection of the trench walls is believed to introduce dislocations in the substrate adjacent the walls of the trench.

Very high temperature anneal processes have been used to reduce the stress in oxide films. Unfortunately, such processes do not appear to have any appreciable affect on the stress in films of polycrystalline silicon ("poly-Si"). No other process are believed to be known for providing significant reduction in the stress in poly-Si films, particularly when used as the fill material for trench storage DRAMs.

Under certain conditions, voids will form in the fill of deep-trench capacitors during the formation thereof. One technique for minimizing the formation of such voids is disclosed in U.S. Pat. No. 4,977,104 to Sawada et al. This technique involves (a) depositing a first doped semiconductor film on a semiconductor substrate, (b) depositing a second undoped semiconductor film on the doped film, and (c) heat treating the substrate to cause the dopants to diffuse from the first film to the second film. In one example discussed in the Sawada et al. patent, a trench electrode having a phosphorous dopant concentration of $1 \times 10^{20}/cm^3$ is formed using the method disclosed in this patent.

In the field of micro-mechanical devices, the need exists under certain circumstances to deform a given structure so that it assumes a predetermined configuration. For instance, silicon micro-mechanical cantilever structures of the type used in light deflector arrays and pressure sensors are known to bend in an undesirable manner due to intrinsic or thermal stresses in such structures. Under certain circumstances, such structures would have greater functionality and/or utility if such deformation could be controlled or eliminated.

SUMMARY OF THE INVENTION

The present invention is a method of depositing a film of material on a substrate so that the film has a predetermined state and amount of stress. By controlling the stress in the film, the forces applied by the layer adjacent regions of the substrate may be precisely controlled.

In one embodiment of the invention, the method involves depositing a layer of crystalline material on a surface of a substrate. Then, a layer of amorphous crystallizable material is deposited on the crystalline layer. Finally, the substrate is heated at a temperature and for a time sufficient to cause the amorphous layer to at least partially crystallize. The layer of amorphous material contracts upon crystallization, thereby reducing the compressive stress in the layer, or, in some cases, changing its state to a tensile stress. Such reduction in, or change in state of, stress in the formerly amorphous layer in turn modifies the forces applied to the structure by the crystalline layer and formerly amorphous layer. Because the state and level of stress in the layer varies primarily as a function of the thickness of the layer, the stress in the layer may be precisely controlled by controlling the thickness of the layer. By controlling the state and level of stress in the formerly amorphous layer in this manner, the forces applied to the substrate by the composite layer consisting of the crystalline layer and formerly amorphous layer may be accurately controlled.

In another embodiment of the invention, the method involves depositing a layer of compressively stressed amorphous material on a selected portion of a substrate. Then, the substrate is heated at a temperature and pressure and for a period of time sufficient to cause the layer of amorphous material to at least partially crystallize. By controlling the thickness of the layer of amorphous material, the forces such layer applies to the substrate may be carefully controlled. In yet another embodiment of the invention, a layer of relatively lightly doped polycrystalline silicon is deposited on the walls of a deep trench formed in a substrate. Then, a layer of intrinsic amorphous silicon is deposited on the layer of polycrystalline silicon to a thickness sufficient to fill the entire trench with silicon. Finally, the substrate is heated to cause the amorphous layer to crystallize and to cause the dopant in the layer of polycrystalline material to diffuse into the layer of formerly amorphous silicon. The dopant level in the polycrystalline silicon layer is selected so that after the heating step is completed, the level of dopant in this layer and in the formerly amorphous layer is lower than dopant levels that can be readily and repeatedly obtained by conventional deposition techniques. Such relatively light doping of the polycrystalline silicon and formerly amorphous silicon layers is believed to reduce the stress in such layers to a level below that ordinarily achieved in silicon trench fill doped to higher, more conventional levels. Thus, the combination of causing the amorphous layer to crystallize and reducing the overall dopant levels in the layers provides a very effective method of reducing stress in trench fill.

Figure 1:
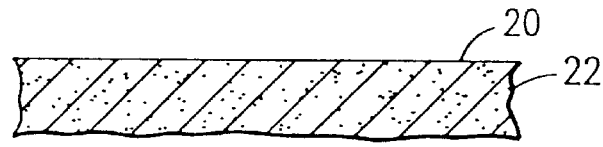
FIG. 1 is an enlarged cross-sectional view of a portion of a substrate.

In the drawings, the thicknesses of the various layers of material have been modified for clarity of illustration and are not necessarily true to scale.

DETAILED DESCRIPTION OF THE INVENTION

Figure 2:
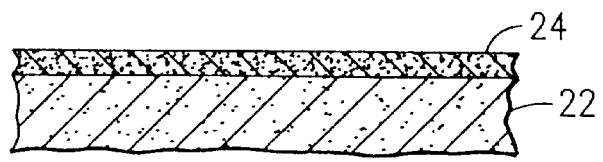
FIG. 2 is similar to FIG. 1, except that a layer of polycrystalline material has been deposited on the substrate.
Figure 3:
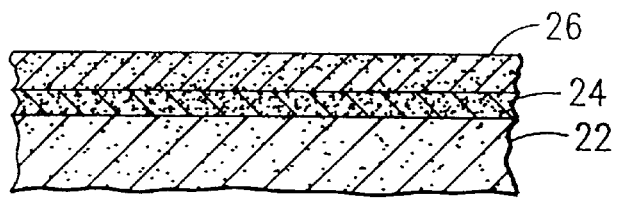
FIG. 3 is similar to FIG. 2, except that a layer of amorphous material hits been deposited on the layer of polycrystalline material.

Referring to FIGS. 1–3, the present invention is a method of providing a predetermined level and state of (i.e., tensile or compressive) stress in a film deposited on a surface 20 of a substrate 22. By selectively controlling the stress in the film, the forces such film imparts to adjacent regions of substrate 22 may be precisely controlled.

More specifically, one embodiment of the present invention involves depositing a layer 24 of crystalline material on surface 20 of substrate 22 and then depositing a layer 26 of crystallizable material on layer 24, as illustrated in FIG. 3. Then, layers 24 and 26 are heated so as to cause layer 26 to at least partially crystallize.

Upon crystallizing, the volume of space occupied by layer 26 changes. The amount of such change, and whether the volume increases or decreases, will vary as a function of the material used as layer 26. However, for most materials, the volume occupied by the layer 26 decreases upon crystallizing. Thus, in the following description of the invention, it is assumed layer 26 is made from a material that decreases in volume upon crystallizing.

As a consequence of the crystallization of layer 26, the level of stress in the layer is reduced, or, in some cases, the state of the stress in the layer is changed. The state and level of stress in layer 26 after crystallization varies primarily as a function of the composition and thickness of the layer. Thus, by appropriate selection of materials for layer 26, and by depositing layer 26 to an appropriate thickness, the state and level of stress in the layer may be precisely controlled. By controlling the stress in layer 26 in this manner, the forces such layer applies to layer 24, and hence to adjacent regions of substrate 22, may also be precisely controlled.

Figure 4:
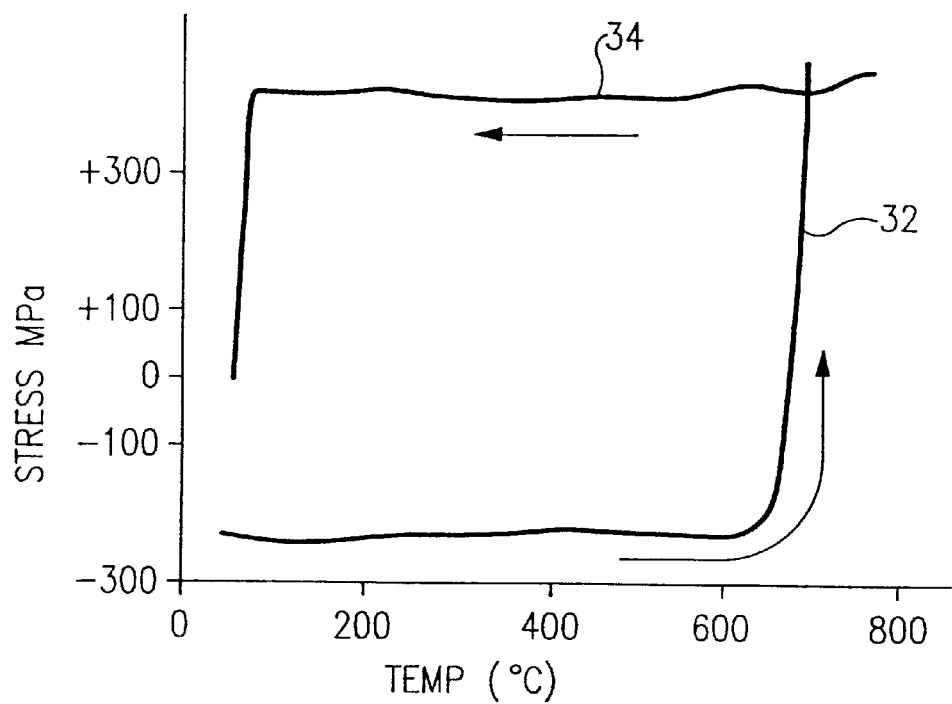
FIG. 4 is a graph indicating the change in stress in the amorphous layer that occurs with changes in temperature.

As an indication of the change in stress in layer 26 that occurs as a consequence of the crystallization thereof, reference should be made to FIG. 4 in which the stress level in an exemplary layer 26 before and after crystallization is illustrated graphically. Layer 26 consisted of intrinsic amorphous silicon deposited to a thickness of 4000 Å. Layer 26 was deposited on a layer 24 of polycrystalline silicon ("poly-Si") having a thickness of about 800 Å. As indicated by line 32 in FIG. 4, layer 26, as originally deposited, had a compressive stress of about 300 MPa ($3\times10^9$ dynes/cm$^2$). Layer 26 was then gradually heated to about 700° C., thereby causing the stress in the layer to decrease very gradually with increases in temperature up to about the 600–700° C. range. When the temperature of layer 26 reached this 600–700° C. range, the compressive stress in layer 26 began decreasing very rapidly and ultimately became tensile. After layer 26 was cooled to about 400° C., the level of tensile stress in the layer stabilized at about 200 MPa ($2\times10^9$ dynes/cm$^2$), as indicated by line 34.

A range of materials ray be used for layers 24 and 26, the primary required, being that layer 26 exist and be depositable in an amorphous state and be crystallizable upon heating. Thus, suitable materials for layers 24 and 26 include semiconductors, metals and salts, with silicon being preferred. Such materials may be deposited on substrate 22 by conventional techniques such as sputtering or chemical vapor deposition ("CVD"). Regardless of the technique used for depositing layers 24 and 26, it is important that the layers be deposited so as to adhere securely to one another and/or to substrate 22, as the case may be. Such adhesion is required so that stresses in the layers may be transmitted to adjacent regions of the substrate.

When layers 24 and 26 are made from semiconductor materials such as silicon, i.e., polycrystalline silicon for layer 24 and amorphous silicon for layer 26, it may be desirable to include an impurity, e.g., boron, in the layers. One technique for achieving a substantially uniform impurity concentration throughout both layers 24 and 26 involves depositing layer 24 so that it is doped to a higher impurity concentration than is ultimately desired and then depositing layer 26 as intrinsic amorphous material. When layers 24 and 26 are heated to cause layer 26 to crystallize, the impurities in layer 24 will diffuse into layer 26 such that the impurity concentration throughout layers 24 and 26 is substantially uniform. A particular advantage of this approach to doping layers 24 and 26 is that relatively low (i.e., 1E19/cm$^3$ to 3E19/cm$^3$ ) impurity concentrations are obtainable in layers 24 and 26 after heating. It tends to be difficult under certain circumstances to routinely and repeatably obtain such relatively low impurity concentrations in polycrystalline silicon used as a structure in various semiconductor devices. Furthermore, it appears that (1) when layer 24 is P-type poly-Si and layer 26 i intrinsic or P-type amorphous silicon and (2) when the dopant concentration in layers and 26, after heating, is maintained in the 1E19/cm$^3$ to 3E19/cm$^3$ range, the stress in such layers is lower than when the dopant concentration is in the more conventional range of 1E20/cm$^3$ to 1E21/cm$^3$.

Although the foregoing technique for doping layers 24 and 26 is preferred, in some cases it may be desirable to deposit layer 24 as intrinsic polycrystalline silicon and layer 26 as doped amorphous silicon. By adding a dopant such as boron to the amorphous silicon layer by known diffusion techniques, the temperature at which the layer must be deposited to retain its amorphous structure decreases. In other cases, it may be desirable to deposit layer 24 as doped polycrystalline silicon and layer 26 as doped amorphous silicon. Furthermore, under certain circumstances, it may be desirable to deposit layer 26 directly on surface 20 of substrate 22 and then deposit layer 24 on top of layer 26.

Figure 5:
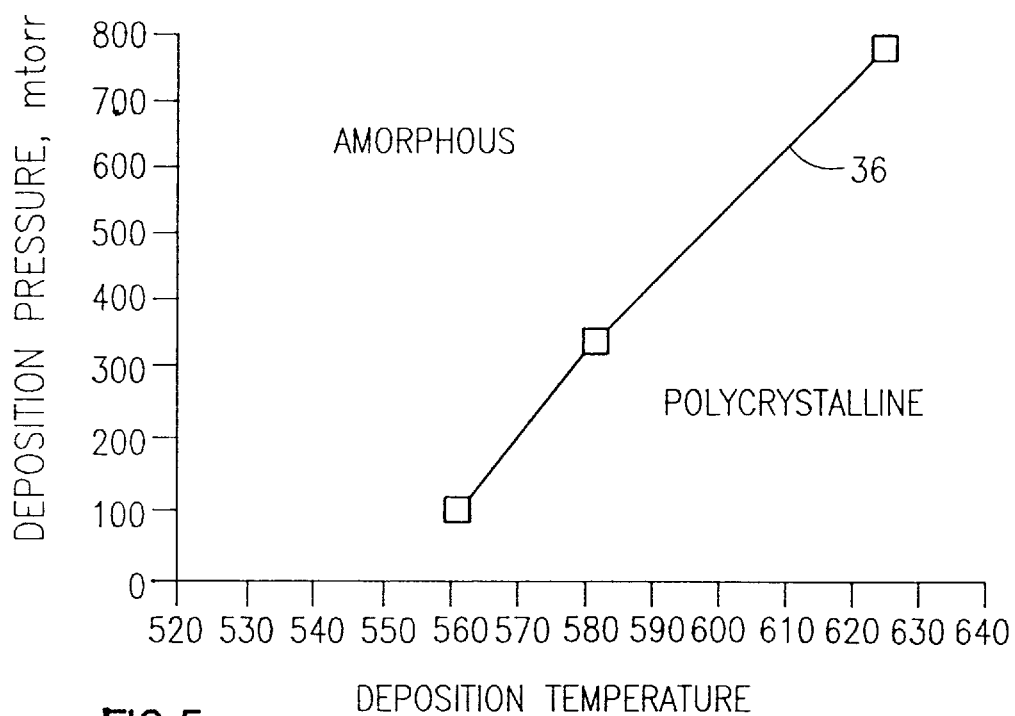
FIG. 5 is a chart indicating deposition parameters for the deposition of the amorphous silicon.

When layers 24 and 26 are made from silicon, the layers may be satisfactorily deposited on surface 20 of substrate 22 using low pressure chemical vapor deposition ("LPCVD")

processes. Such processes may be performed, for instance, using a LPCVD apparatus of the type sold by General Signal Thinfilm Corporation, Fremont, Calif. Although the specific operating parameters for the LPCVD apparatus will vary depending upon the apparatus used, for a General Signal LPCVD furnace, the temperature and pressure operating parameters required for the deposition of intrinsic amorphous silicon as layer 26 are set forth in FIG. 5. To ensure the silicon for layer 26 is deposited in the amorphous state, a set of operating parameters falling to the left of the diagonal line identified by reference numeral 36 should be selected.

The forces applied by layers 24 and 26 to adjacent regions of substrate 22 may be determined based on empirical testing. Such testing involves depositing layers 24 and 26 at a range of different thicknesses and impurity concentrations, and then measuring the deformation of surface 20 of substrate 22 using, for instance, known reflectivity measuring techniques. Such reflectivity measurements may be performed using a reflectivity tool of the type manufactured by Flexus, Inc., 544 Weddel Drive, Suite 7, Sunnyvale, Calif. By correlating the characteristics of layers 24 and 26 with the type (i.e., convex or concave) and extent of deformation of surface 20, the deposition parameters required to achieve layers 24 and 26 that impart the desired forces to adjacent regions of substrate 22 may be determined.

In practice, the ratio of the thicknesses of crystalline layer 24 and the amorphous layer 26 may vary over a relatively wide range, depending upon the desired impurity concentration, stress, and overall thickness of the layers. However, satisfactory ratios for the thicknesses of layers 24 and 26 when made from relatively heavily doped poly-Si and intrinsic amorphous silicon, respectively, tend to be about 1:10.

The above-described method of controlling the state and level of stress in a film deposited on a substrate may be used to fill the trench of a trench-storage capacitor of the type used in the current generation of trench-storage DRAMs. Thus, when used as the fill for a deep trench, layers 24 and 26 are deposited in accordance with the deposition techniques and parameters discussed above. The stress in such trench fill may be precisely controlled, as also discussed above.

By controlling the amount and type of stress in the trench fill, the forces such fill applies to portions of the DRAM substrate adjacent the trench may be precisely controlled. By controlling such forces, the formation of dislocations in the substrate adjacent the trench may be reduced significantly. Because such dislocations apparently provide a pathway through which charge may leak from the capacitor, by reducing the formation of dislocations, it is believed that the retention time of the associated DRAM will increase.

EXAMPLE 1

Figure 6:
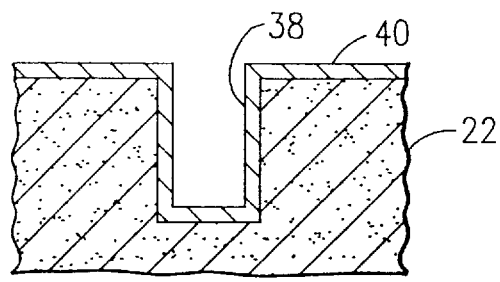
FIG. 6 is a cross-sectional view of a substrate having a deep trench formed therein and having a thin layer of intrinsic polycrystalline silicon deposited in the trench and on adjacent regions of the substrate.
Figure 7:
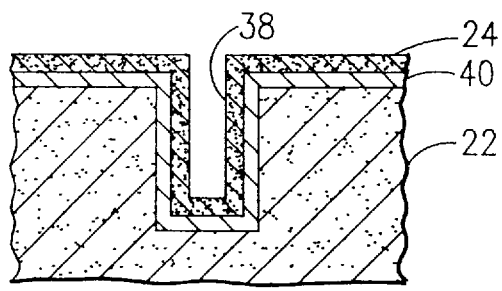
FIG. 7 is similar to FIG. 6, except that a heavily doped layer of polycrystalline silicon has been deposited on the layer of intrinsic polycrystalline silicon.
Figure 8:
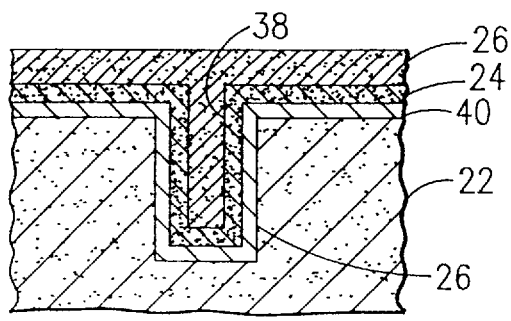
FIG. 8 is similar to FIG. 7, except that a relatively thick layer of amorphous silicon has been deposited on the layer of heavily doped polycrystalline silicon.

Referring to FIGS. 6–8, the method described above was used in the fabrication of a deep-trench capacitor for a trench-storage DRAM device. More specifically, the method was used to fill a plurality of trenches 38 in a silicon substrate 22, each having a depth of about 9 μm, a width of about 7000 Å and substantially vertical walls (i.e., walls that do not bow inwardly or outwardly). A dielectric material, such as silicon nitride or a thermal oxide, was deposited on the walls of the trench prior to initiation of the trench fill process described hereinafter.

As the first step, a relatively thin, i.e., about 100 Å thick, layer 40 of intrinsic polycrystalline silicon was deposited on the walls of each trench 38 and adjacent surface regions of substrate 22. Deposition of this layer was accomplished using a LPCVD furnace of the type manufactured by General Signal Technology Corporation, at a temperature of 560° C., a pressure of 150 μT, with a $SiH_4$ flow rate of 350 sccm, a $H^2$ flow rate of 30 sccm, for about 2 minutes. Layer 40 was deposited to ensure the furnace had reached steady-state operation prior to the deposition of layer 24.

Next, a layer 24 of relatively lightly doped P-type polycrystalline silicon was deposited on layer 40 while the substrate remained positioned in the LPCVD furnace used for the deposition of layer 40. The process for depositing layer 24 was the same as that described above with respect to layer 40, except that a 1% $BCL_3$ flow of 45 sccm is added and the deposition process is conducted for about 17 minutes rather than about 2 minutes. This deposition step produced a layer 24 of polycrystalline silicon having a thickness of about 800 Å and a dopant concentration of about about $2E20/cm^3$.

Then, with substrate 22 remaining in the LPCVD furnace, a layer 26 of intrinsic amorphous silicon was deposited on layer 24 to a depth such that the remaining opening in each trench 38 was filled with amorphous silicon. The deposition parameters for layer 26 were the same as those for layer 40, discussed above, except that the deposition time was increased from about 2 minutes to about 6 hours and 10 minutes. Layer 26 had a thickness of about 5200 Å.

Finally, substrate 22 was annealed at about 950° C. in a nitrogen atmosphere for about 20 minutes. This annealing step caused the impurities in layer 24 to diffuse relatively evenly throughout layers 40 and 26, such that these layers had a relatively uniform dopant level of about $1E19/cm^3$. In addition, the annealing step caused layer 26 to crystallize, thereby causing the layer to shrink.

After completion of the annealing step, the stress in the film consisting of layers 24, 26 and 40 was measured. This film was found to have a tensile stress of about 200 MPa ($2 \times 10^9$ dynes/$cm^2$). By comparison, layer 26 had a compressive stress of about 300 MPa ($3 \times 10^9$ dynes/$cm^2$) as originally deposited. Reflectivity measurements of substrate 22 revealed a change in curvature of the top surface of the substrate, i.e., the top surface became more planar. Such change in configuration of substrate 22 has been attributed to a reduction in the amount the walls of each trench 38 bow outwardly due to a decrease in the stress in the film consisting of layers 24, 26 and 40 used to fill the trench. By contrast, in cases where a deep trench was filled entirely with poly-Si, the stresses in such poly-Si fill have been determined to cause the walls of such trench to bow outwardly a significant amount. Such outward deflection of the trench walls is believed to introduce dislocations into adjacent portions of the silicon substrate after subsequent process steps such as oxidation or ion implantation.

Figure 9:
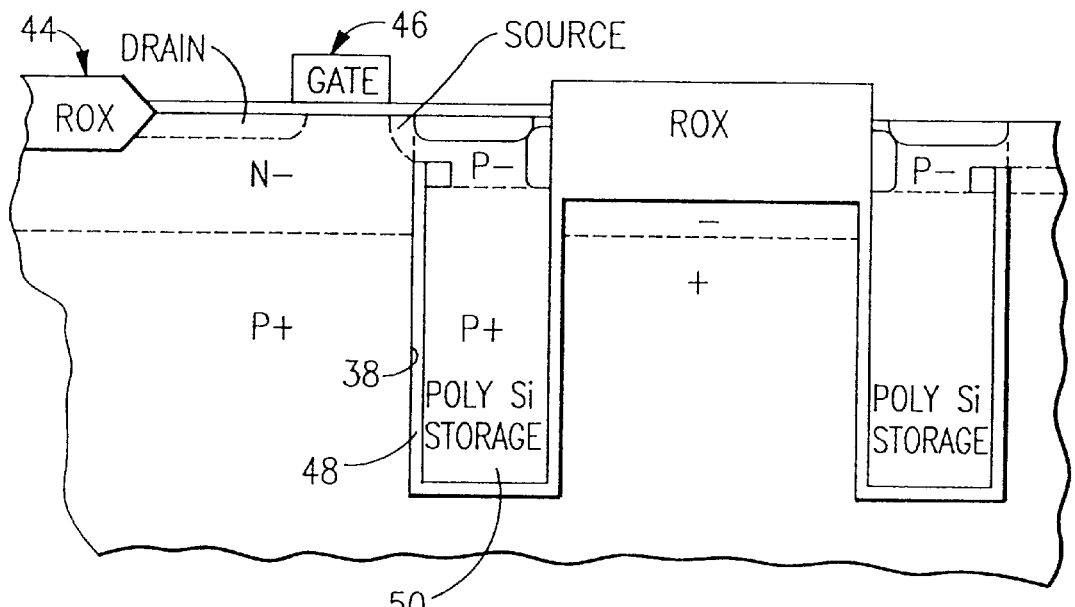
FIG. 9 is a schematic cross-sectional side view of a DRAM.

Referring to FIG. 9, as those of ordinary skill in the art appreciate, the fabrication of a trench-storage DRAM requires the formation of certain additional structure positioned adjacent, and electrically coupled with, the material used to fill trench 38. Techniques for fabricating associated structure such as access transistors for controlling the release of charge stored in trench 38, are disclosed, for instance, in U.S. Pat. No. 4,688,063 to Lu et al, issued Aug. 17, 1987 (the "'063 patent"), and U.S. Pat. No. 4,801,988 to Kenney, issued. Jan. 31, 1989 (the "'988 patent"), which patents are incorporated herein by reference. Techniques for forming structure for electrically coupling such associated structure with the trench capacitor are disclosed in U.S. Pat. No.

4,873,205 (the "'205 patent") to Critchlow et al., which patent is incorporated herein by reference.

Thus, in fabricating a DRAM 44 (FIG. 9) in which the trench is filled with material in accordance with the process described above, an access transistor 46 is formed adjacent the trench. Known fabrication techniques of the type described in the '063 and '988 patents may be used to fabricate transistor 46. Additionally, prior to filling trench 38 with layers 24 and 26, or layers 40, 24 and 26, as desired, a layer 48 of insulating material is deposited on the walls of trench 38. One electrode of the trench storage capacitor is formed at the interface of the insulating layer 48 and the trench fill material 50 which comprises the combination of layers 24 and 26 or layers 40, 24 and 26, as desired. The second electrode is formed at the interface of insulating layer 48 and portions of the substrate adjacent trench 38. Although not clearly illustrated in FIG. 9, structure is also provided for electrically connecting transistor 46 with the first electrode of the capacitor. Techniques for forming such structure are disclosed in the '205 patent. Other aspects of the fabrication of a DRAM 44 in which the trench of the capacitor is filled with material in accordance with the method of the present invention are disclosed in the '063, '988, and '205 patents, including techniques for forming an array (not shown) of DRAMs 44.

The method of the present invention may also be used in conjunction with a wide range of other processes in which it is desired to apply predetermined forces to portions of a structure adjacent the surface on which the film is deposited. For instance, the present invention has application in the manufacture of micro-mechanical devices in silicon substrates of the type disclosed by R. Howe et al. in the abstract entitled "Polycrystalline Silicon Micromechanical Beams," published by the Electrochemical Society, Inc, Extended Abstracts of the Electronics Division, Spring Meeting, May 9–14, 1982. When used in this manner, the first step of the above-described method, i.e., depositing a layer of crystalline material (e.g., poly-Si), may be omitted. Thus, the layer of amorphous material is deposited directly on the surface of the substrate in accordance with the temperature and pressure deposition parameters discussed above.

Figure 10:
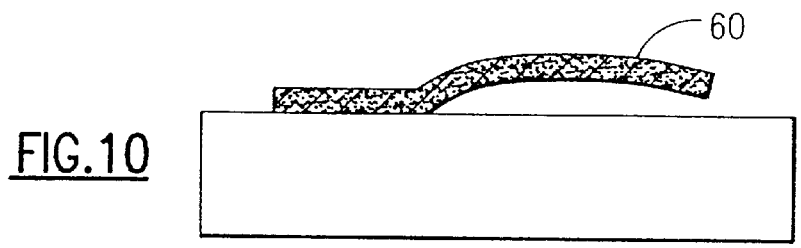
FIG. 10 is a side elevation view of a silicon micro-mechanical cantilever that bows downwardly slightly along the length thereof.

As discussed briefly above, due to intrinsic or thermal stresses present in poly-Si micromechanical structures, the configuration of such structures may deviate from what is desired. For instance, under certain circumstances, micro-mechanical cantilever beams may bow upwardly or downwardly due to stresses present in the beams, as illustrated FIG. 10 with respect to beam 60. Such deformation of the beams can adversely affect the pressure sensing, light deflection or other functions to be accomplished by the beams.

Figure 11:
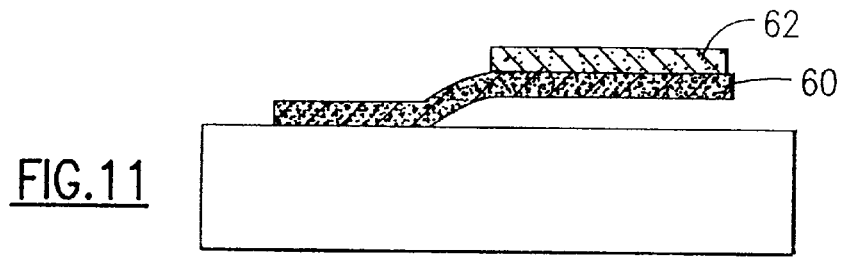
FIG. 11 is similar to FIG. 10, except that a layer of material has been deposited on the top surface of the cantilever.

To overcome this problem, a layer 62 of amorphous material may be deposited on a surface of the beam and then annealed so as to cause the layer to at least partially crystallize. For most amorphous materials, such crystallizing cause layer 62 to shrink, thereby decreasing the level and/or state of stress in the layer. By appropriate selection of materials, layer thickness and/or dopant levels, the change in stress in layer 62 may be precisely tailored such that after annealing the layer imparts those forces to beam 60 required to reduce or eliminate the deformation. As illustrated in FIG. 11, after annealing, layer 62 imparts forces to beam 60 that eliminate the bowing of the beam. The precise thickness and/or dopant levels of layer 62 required to eliminate the deformation of beam 60 may be empirically determined using the reflectivity measurement technique discussed above. When layer 62 is made from amorphous silicon, the layer may be deposited using a LPCVD furnace operated in accordance with the parameters set forth in FIG. 5, as discussed above.

Figure 12:
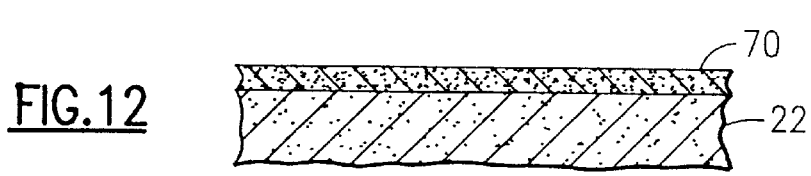
FIG. 12 is an enlarged cross-sectional view of a substrate on which a doped layer of polycrystalline silicon has been deposited.
Figure 13:
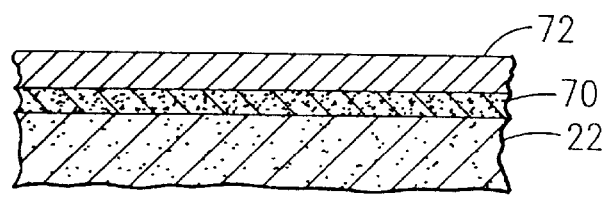
FIG. 13 is similar to FIG. 12 except that a layer of intrinsic polycrystalline silicon has been deposited on the doped layer of polycrystalline silicon.

As discussed above, it is believed that the stress in a P-type poly-Si film having a dopant concentration in the range $1E19/cm^3$ to $3E19/cm^3$ is lower than the stress in a P-type poly-Si film having a dopant concentration in the more conventional range of $1E20/cm^3$ to $1E21/cm^3$. Another embodiment of the invention, illustrated in FIGS. 12 and 13, relies on this finding as a technique for reducing stress in a poly-Si film.

As the first step in the method of this alternative embodiment, a layer 70 of relatively lightly doped P-type poly-Si is deposited on a substrate 22 using conventional LPCVD techniques, as discussed above. Then, a layer 72 of undoped poly-Si is deposited on layer 70, also using conventional LPCVD technique of the type discussed above. Finally, layers 70 and 72 are heated for a time and to a temperature sufficient to cause the dopant in layer 70 to diffuse substantially evenly throughout layer 72.

The dopant concentration of layer 70 is selected so that after the heating step, the dopant concentration in layers 70 and 72 ranges from $1E19/cm^3$ to $3E19/cm^3$. The dopant concentration of layer 70, as originally deposited, required to achieve a dopant concentration of $1E19/cm^3$ to $3E19/cm^3$ will vary as a function of the relative thicknesses of layers 70 and 72. However, in one version of the method, layer 70 is originally deposited at a boron dopant concentration of $1E20/cm^3$ and a thickness of 800 Å, with the intrinsic poly-Si layer 72 having a thickness of 3,200 Å. In this example, layer 70 and 72 were heated to a temperature of 950° C. for about 20 minutes. The resultant dopant concentration in the film consisting of layers 70 and 72 was about $5E18/cm^3$ to $3E19/cm^3$.

The influence of relatively low dopant levels on the stress in layers 70 and 72 has been demonstrated most convincingly when these layers are made from P-type poly-Si. Although the mechanism(s) responsible for the reduction in stress in layers 70 and 72 as a result of relatively light doping levels is not entirely understood, it is believed that with respect to P-type poly-Si, the relatively large difference in ionic radius of boron atoms (0.23 Å) and silicon atoms (0.41 Å) is responsible for the stress reduction. In this regard, it is hypothesized that the space occupied by the crystalline lattice of the poly-Si decreases due to the smaller ionic radius of boron atoms. Such reduction in space apparently decreases the volume occupied by layer 70 which in turn is believed to decrease the stress in the layer. By decreasing the stress in layer 70, the forces applied by the composite layer consisting of layers 70 and 72 will be reduced.

The ionic radius of dopant materials such as arsenic and phosphorous used in N-type poly-Si more closely approximates the ionic radius of silicon. Therefore, it is believed that little stress reduction will occur in N-type poly-Si by decreasing the dopant concentration to the range achieved with P-type poly-Si, i.e., $5E18/cm^3$ to $3E19/cm^3$. Thus, it is preferred that layers 70 and 72 be made from P-type poly-Si.

Layers 70 and 72 may be used as fill for a deep trench (not shown) of the type used in trench-storage DRAMs. As discussed above, by minimizing the stress in the fill for deep trenches, the forces such fill apply to adjacent portions of the substrate in which the deep trench is formed are reduced. Such reduction is, in turn, believed to reduce the incidence of dislocations in regions of the substrate adjacent the trench.

The precise level of stress in layers 70 and 72 may be controlled by empirically determining the relationship between (1) the dopant concentration of layer 70 and the thicknesses of layer 70 and 72, and (2) the stress in such layers after annealing. Such empirical determination may be made using reflectivity measurements of the type discussed above.

Since certain changes may be made in the process described herein, it is intended that the foregoing description and accompanying drawings shall be interpreted in an illustrative and not in a limiting sense.

What is claimed is:

1. A method of filling a trench in a silicon substrate, the method comprising the steps of:
   (a) depositing a first layer of intrinsic silicon on the walls of the trench;
   (b) depositing a second layer of doped polycrystalline silicon on said first layer;
   (c) depositing a third layer of amorphous silicon on said second layer; and
   (d) annealing the substrate for a time and at a temperature sufficient (i) to cause dopant in said second layer to diffuse into said third layer and (ii) to cause said third layer to crystallize.

2. A method for controlling an amount of stress imparted to a substrate comprising the steps of:
   (a) depositing a first layer of intrinsic polycrystalline silicon on walls of a trench;
   (b) after step (a) depositing a first layer of doped polycrystalline silicon on the walls of the trench;
   (c) depositing amorphous silicon on the polycrystalline silicon to fill the trench; and
   (d) heating the substrate to (i) at least partially crystallize the amorphous silicon, (ii) to reduce compressive stress in the deposited layers filling the trench upon crystallization of the amorphous silicon, (iii) to diffuse dopant from the doped polycrystalline silicon into the amorphous silicon, and (iv) to impart a compressive stress from the deposited layers to the substrate upon crystallization of the amorphous silicon.

* * * * *